(12) United States Patent
Li et al.

(10) Patent No.: US 11,474,027 B1
(45) Date of Patent: Oct. 18, 2022

(54) METHOD AND SYSTEM FOR REGULATING PHOTOELECTRIC SPECTRAL RESPONSE RANGE

(71) Applicant: Jilin University, Changchun (CN)

(72) Inventors: Quanjun Li, Changchun (CN); Zonglun Li, Changchun (CN); Haiyan Li, Changchun (CN); Bingbing Liu, Changchun (CN)

(73) Assignee: Jilin University, Changchun (CN)

( * ) Notice: Subject to any disclaimer, the term of this patent is extended or adjusted under 35 U.S.C. 154(b) by 0 days.

(21) Appl. No.: 17/398,963

(22) Filed: Aug. 10, 2021

(30) Foreign Application Priority Data

May 11, 2021 (CN) .......................... 202110509687.1

(51) Int. Cl.
*G01N 21/27* (2006.01)
*H04N 5/33* (2006.01)
*H01L 27/146* (2006.01)
*G01J 1/42* (2006.01)

(52) U.S. Cl.
CPC ................ *G01N 21/27* (2013.01); *G01J 1/42* (2013.01); *H01L 27/14649* (2013.01); *H04N 5/33* (2013.01)

(58) Field of Classification Search
CPC ..... G01N 21/27; G01J 1/42; H01L 27/14649; H04N 5/33
See application file for complete search history.

(56) References Cited

PUBLICATIONS

Li et al. ("Pressure-Tailored Band Engineering for Significant Enhancements in the Photoelectric Performance of CsI3 in the Optical Communication Waveband," Advanced Functional Material, vol. 32, published online Nov. 9, 2021). (Year: 2021).*

* cited by examiner

*Primary Examiner* — David P Porta
*Assistant Examiner* — Meenakshi S Sahu
(74) *Attorney, Agent, or Firm* — Bochner IP, PLLC; Andrew D. Bochner

(57) ABSTRACT

A method for regulating a photoelectric spectral response range, including: pre-pressurizing a gasket material, and drilling a circular hole at the center of indentation as a sample chamber; padding the sample chamber with a layer of photoelectric material, where two ends of the photoelectric material each are connected to one platinum sheet as an electrode; respectively connecting the two electrodes to probes of a digital source-meter, and using the digital source-meter to apply a 5 V bias voltage to the photoelectric material; placing a pressure calibration substance for pressure calibration; applying a high pressure to the photoelectric material, to make a pressure in the sample chamber reach a preset pressure; irradiating a near-infrared laser onto the photoelectric material through diamonds, controlling the presence or absence of illumination, and using the digital source-meter to display a current-time curve at the preset pressure; and determining a photoelectric spectral response range.

18 Claims, 4 Drawing Sheets

METHOD AND SYSTEM FOR REGULATING PHOTOELECTRIC SPECTRAL RESPONSE RANGE

CROSS REFERENCE TO RELATED APPLICATION

This patent application claims the benefit and priority of Chinese Patent Application No. 202110509687.1, filed on May 11, 2021, the disclosure of which is incorporated by reference herein in its entirety as part of the present application.

TECHNICAL FIELD

The present disclosure relates to the field of regulating photoelectric material performance with pressure, and in particular, to a method and system for regulating a photoelectric spectral response range.

BACKGROUND ART

As a core part of the optoelectronics industry, photoelectric detectors are widely used in many fields such as optoelectronic display, optical communications, imaging, and security inspection. With the development of society, photoelectric detectors with high responsivity, high detectivity, and a wide spectral response range have been urgently required for future development. However, application fields of an existing photoelectric detector is often limited by a band gap of a photoelectric material. A large band gap of a photoelectric materials causes a narrow spectral response range of the photoelectric material and a narrow detection bandwidth, thus limiting the application fields of the photoelectric detector. Therefore, the application fields of the photoelectric detector can be greatly expanded by extending the spectral response range of the photoelectric material. As an important external stimulus, a high pressure is a powerful means to change a structure and band gap of a material, which makes it possible to adjust a spectral response range of an optoelectronic functional material. However, although a high pressure has been proved to be effective in adjusting the performance of photoelectric related materials, there is no related researches on expanding the photoelectric spectral response range with a high pressure.

SUMMARY

An objective of the present disclosure is to provide a method and system for regulating a photoelectric spectral response range, to resolve a problem that a photoelectric detector in the prior art has limited application fields.

To achieve the foregoing objective, the present disclosure provides the following solutions:

The present disclosure provides a method for regulating a photoelectric spectral response range, including:

pre-pressurizing a gasket material by using a diamond anvil cell, and using a laser to drill a circular hole at the center of indentation as a sample chamber;

padding the sample chamber with a layer of photoelectric material, where two ends of the photoelectric material each are connected to one platinum sheet as an electrode;

respectively connecting the two electrodes to probes of a digital source-meter, and using the digital source-meter to apply a 5 V bias voltage to the photoelectric material;

placing a pressure calibration substance in the sample chamber of the diamond anvil cell for pressure calibration;

closing the diamond anvil cell, rotating pressurizing screws, and applying a high pressure to the photoelectric material, to make a pressure in the sample chamber reach a preset pressure;

irradiating a near-infrared laser onto the photoelectric material through diamonds, controlling the presence or absence of illumination, and using the digital source-meter to display a current-time curve at the preset pressure; and determining a photoelectric spectral response range based on current-time curves at a plurality of different preset pressures.

Optionally, insulation is performed between the electrodes and the sample chamber.

Optionally, the insulation between the electrodes and the sample chamber is performed in the following manner:

filling the sample chamber with boron nitride powder and pre-pressurizing to 20 GPa or higher, to make the boron nitride powder closely fit the sample chamber for insulation.

Optionally, the respectively connecting the two electrodes to probes of a digital source-meter specifically includes:

respectively connecting insulation-removed ends of two enameled wires to the two electrodes, connecting the other end of one of the enameled wires to one probe of the digital source-meter, and connecting the other end of the other enameled wire to the other probe of the digital source-meter.

Optionally, the controlling the presence or absence of illumination, and using the digital source-meter to display a current-time curve at the preset pressure specifically includes:

setting a time with illumination as a first setting time and a time without illumination as a second setting time, the sum of the first setting time and the second setting time being one period, and displaying the current-time curve at the preset pressure by means of the digital source-meter.

Optionally, the applying a high pressure to the photoelectric material specifically includes:

setting an initial pressure to 1.2 GPa, and keeping a pressure gradient within 1.5 GPa.

Optionally, the high pressure ranges from 1.2 GPa to 5.8 GPa.

Optionally, the photoelectric material is semiconductor iodine.

Optionally, the pressure calibration substance is a ruby.

The present disclosure provides a system for regulating a photoelectric spectral response range, where the system for regulating a photoelectric spectral response range is applied to the above-described method for regulating a photoelectric spectral response range, and the system for regulating a photoelectric spectral response range comprises: an diamond anvil cell, a gasket material, a photoelectric material, two platinum electrodes, and a digital source-meter, where the diamond anvil cell comprises pressurizing screws, and the pressurizing screws are configured to apply a high pressure to the photoelectric material;

the gasket material includes a sample chamber, and culet faces of the diamond anvil cell are embedded in the sample chamber; and the photoelectric material is placed in the sample chamber, the culets are on the photoelectric material, and the photoelectric material and the sample chamber are insulated from each other; and two ends of the photoelectric material each are connected to one of the platinum electrodes, and the two platinum electrodes are respectively connected to probes of the digital source-meter; and the digital source-meter is used to apply a 5 V bias voltage to the photoelectric material and display a current-time curve at a preset pressure.

According to the specific embodiments provided in the present disclosure, the present disclosure has the following technical effects:

According to the present disclosure, a near-infrared laser source is used to irradiate the photoelectric material, and the presence or absence of illumination is controlled; a diamond anvil cell device is used to pressurize the photoelectric material, and current-time curves at a plurality of pressure points are observed and recorded to determine whether the photoelectric material produces a light response, so as to obtain a photoelectric spectral response range. By regulating a pressure of the photoelectric material, a band gap of the photoelectric material is changed, thereby widening a response range of the photoelectric material and expanding application fields of a photoelectric detector.

BRIEF DESCRIPTION OF THE DRAWINGS

To describe the technical solutions in embodiments of the present disclosure or in the prior art more clearly, the following briefly describes the accompanying drawings required for describing the embodiments of the present disclosure. Apparently, the accompanying drawings in the following description show merely some embodiments of the present disclosure, and a person of ordinary skill in the art may still derive another drawing from these accompanying drawings without creative efforts.

Figure 1:
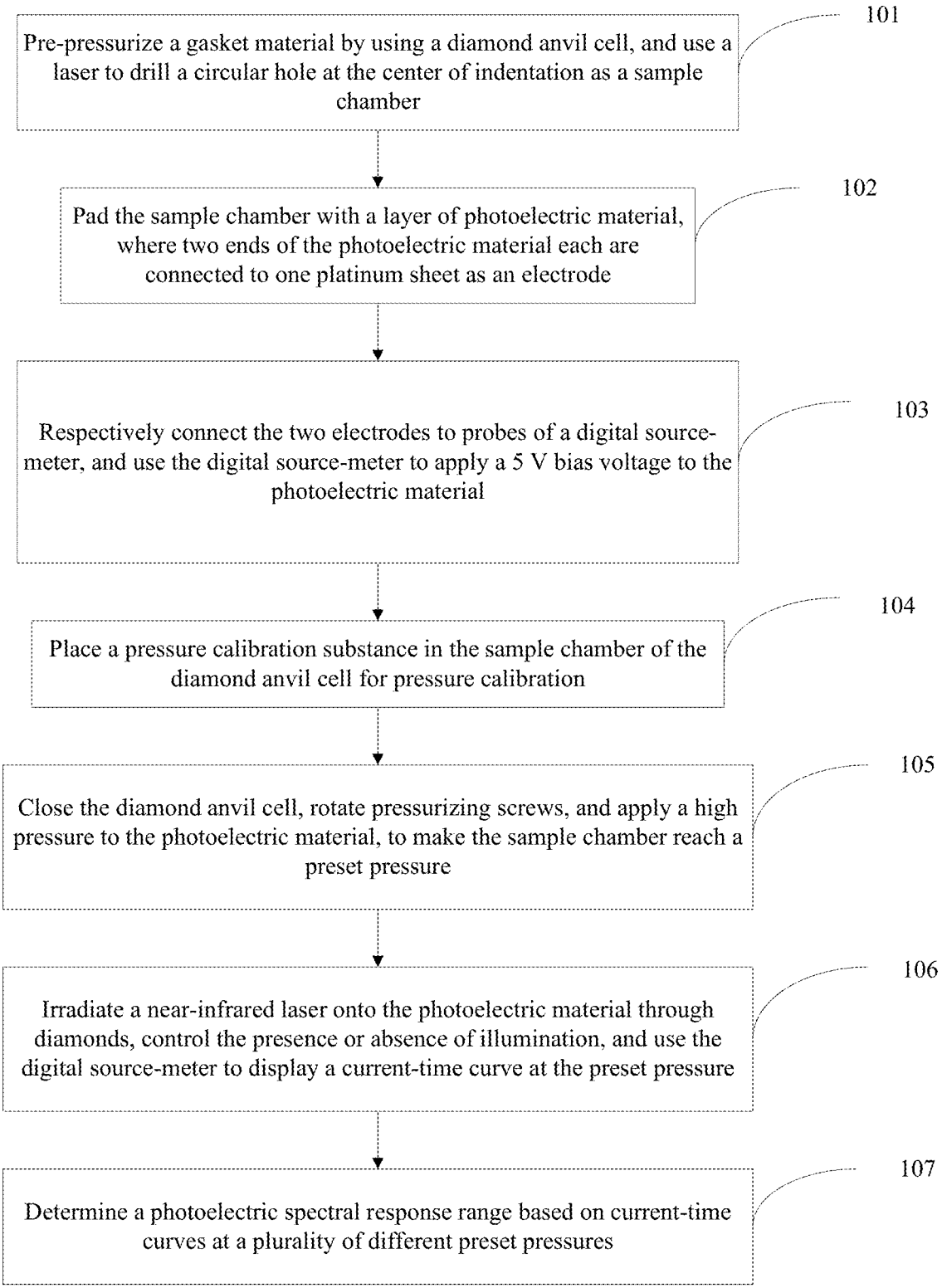
FIG. 1 is a flowchart of a method for regulating a photoelectric spectral response range according to the present disclosure.

Reference numerals: 1. Diamond anvil cell; 2. Gasket material; 3. Photoelectric material; 4. Platinum electrode; 5. Digital source-meter; 6. Pressure calibration substance; 7. Boron nitride powder; and 8. Near-infrared laser.

DETAILED DESCRIPTION OF THE EMBODIMENTS

The technical solutions of the embodiments of the present disclosure are clearly and completely described below with reference to the accompanying drawings. Apparently, the described embodiments are merely a part rather than all of the embodiments of the present disclosure. All other embodiments obtained by a person of ordinary skill in the art based on the embodiments of the present disclosure without creative efforts shall fall within the protection scope of the present disclosure.

An objective of the present disclosure is to provide a method and system for regulating a photoelectric spectral response range, to resolve a problem that a photoelectric detector in the prior art has limited application fields.

To make the foregoing objective, features, and advantages of the present disclosure clearer and more comprehensible, the present disclosure will be further described in detail below with reference to the accompanying drawings and specific embodiments.

The experiment of adjusting a photoelectric spectral response range of semiconductor iodine (with a band gap of 1.43 eV) is carried out in a diamond anvil cell (DAC). An anvil device composed of two symmetrical diamonds each having a culet diameter of 300 μm is used to generate a high pressure.

Embodiment 1

FIG. 1 is a flowchart of a method for regulating a photoelectric spectral response range according to the present disclosure. As shown in FIG. 1, the method for regulating a photoelectric spectral response range includes the following steps:

Step 101: Pre-pressurize a gasket material 2 by using a diamond anvil cell 1, and use a laser to drill a circular hole at the center of indentation as a sample chamber. Specifically, the diamond anvil cell 1 having a culet diameter of 300 μm is used to pre-pressurize the gasket material 2, a T301 steel sheet used as the gasket material 2 is pre-pressurized by a thickness of about 40 μm, and a circular hole with a diameter of 120 μm is drilled by using a laser at the center of indentation as a sample chamber.

The insulation between the electrodes and the sample chamber is performed in the following manner:

The sample chamber is filled with boron nitride powder 7 and pre-pressurized to 20 GPa or higher, to make the boron nitride powder 7 closely fit the sample chamber for electrical insulation between the platinum electrodes 4 and the gasket material 2. A layer of boron nitride (c-BN) is sandwiched between the gasket material 2 and the culets of the diamond anvil cell 1 to achieve electrical insulation between the platinum electrode 4 and the gasket material 2.

Step 102: Pad the sample chamber with a layer of photoelectric material 3, where two ends of the photoelectric material 3 each are connected to one platinum sheet as an electrode. Specifically, after being insulated, the sample chamber is padded with a layer of photoelectric material 3, the semiconductor iodine is used as the photoelectric material 3, and the two ends of the photoelectric material 3 each are connected to one platinum sheet as an electrode.

Step 103: Respectively connect the two electrodes to probes of a digital source-meter 5, and use the digital source-meter 5 to apply a 5 V bias voltage to the photoelectric material 3. Specifically, the two electrodes are respectively connected to the probes of the digital source-meter 5, and the digital source-meter 5 is used as a test system, where a Keithley 2461 digital source-meter is used as the digital source-meter, and a 5 V bias voltage is applied to the semiconductor iodine by using the digital source-meter 5.

The respectively connecting the two electrodes to probes of a digital source-meter 5 specifically includes:

connecting insulation-removed parts of two 0.1-mm enameled wires to the two electrodes respectively by using a silver conductive adhesive, connecting the other end of one of the enameled wires to one probe of the digital source-meter 5, and connecting the other end of the other enameled wire to the other probe of the digital source-meter 5.

Step 104: Place a pressure calibration substance 6 in the sample chamber of the diamond anvil cell 1 for pressure calibration. Specifically, the pressure calibration substance 6 is placed in the sample chamber of the diamond anvil cell 1 for pressure calibration, where the pressure calibration substance 6 is a ruby.

Step 105: Close the diamond anvil cell 1, rotate pressurizing screws, and apply a high pressure to the photoelectric material 3, to make a pressure in the sample chamber reach a preset pressure. Specifically, the diamond anvil cell 1 is closed, and the pressurizing screws are slowly rotated by using a hex wrench, to drive the upper and lower diamonds to approach each other and thereby apply a high pressure to the semiconductor iodine, such that a pressure in the sample chamber is greater than an ambient pressure. An experimental pressure ranges from 1.2 GPa to 5.8 GPa, and the pressure is calibrated by the ruby. The enameled wires with insulation-removed ends are connected to the two probes of the Keithley digital source-meter 5, and a 5 V bias voltage is applied to the semiconductor iodine by the digital source-meter 5, to make the pressure in the sample chamber reach the preset pressure. An initial pressure is set to 1.2 GPa, and a pressure gradient is kept within 1.5 GPa. The high pressure ranges from 1.2 GPa to 5.8 GPa. Selected test pressures are 1.2 GPa, 2.5 GPa, 4.6 GPa, and 5.8 GPa, respectively, and the test pressures are preset pressures.

In practical applications, the high pressure range is not limited to the range of 1.2 GPa to 5.8 GPa. According to application requirements, a pressure higher than 5.8 GPa may be selected to regulate a photoelectric spectral response range.

Step 106: Irradiate a near-infrared laser onto the photoelectric material 3 through diamonds, control the presence or absence of illumination, and use the digital source-meter 5 to display a current-time curve at the preset pressure. Specifically, a near-infrared laser 8 with a wavelength of 1064 nm is used to irradiate the semiconductor iodine through the diamonds, and an optical power density of the laser illumination onto the semiconductor iodine is about 0.8 mW/cm$^2$. An electronic shutter is used to precisely control a time with or without illumination. The time with/without illumination is set to 30 seconds, and one cycle is 60 seconds. By recording and observing current-time curves for 5 cycles, it is determined whether the semiconductor iodine has a photoresponse to the near-infrared light with the wavelength of 1064 nm.

The controlling the presence or absence of illumination, and using the digital source-meter 5 to display a current-time curve at the preset pressure specifically includes:

setting a time with illumination as a first setting time and a time without illumination as a second setting time, the sum of the first setting time and the second setting time being one period, and displaying the current-time curve at the preset pressure by means of the digital source-meter 5. Current-time curves with/without the irradiation of the 1064 nm near-infrared laser 8 are recorded. The results show that there is no photoresponse at the initial pressure of 1.2 GPa, and a photoresponse appears when the pressure is increased to 2.5 GPa. As the pressure is further increased, the resulting photoresponse is significantly enhanced.

Step 107: Determine a photoelectric spectral response range based on current-time curves at a plurality of different preset pressures.

Embodiment 2

After sample preparation is completed, the pressurizing screws are slowly rotated by using the hex wrench, to drive the upper and lower diamonds to approach each other and thereby apply a pressure to the semiconductor iodine, such that the pressure in the sample chamber is 1.2 GPa, and the pressure is calibrated by the ruby.

The enameled wires with insulation-removed ends are connected to the two probes of the digital source-meter 5, and a 5 V bias voltage is applied to the semiconductor iodine by the digital source-meter 5. A near-infrared laser 8 source with a wavelength of 1064 nm is used to irradiate the semiconductor iodine through the diamonds, and an optical power density of the laser irradiated onto the semiconductor iodine is about 0.8 mW/cm$^2$. An electronic shutter is used to precisely control a time with or without illumination. The time with/without illumination is set to 30 seconds, and one cycle is 60 seconds. By recording and observing current-time curves for 5 cycles, it is determined whether the semiconductor iodine has a photoresponse to the near-infrared light with the wavelength of 1064 nm.

Figure 2:
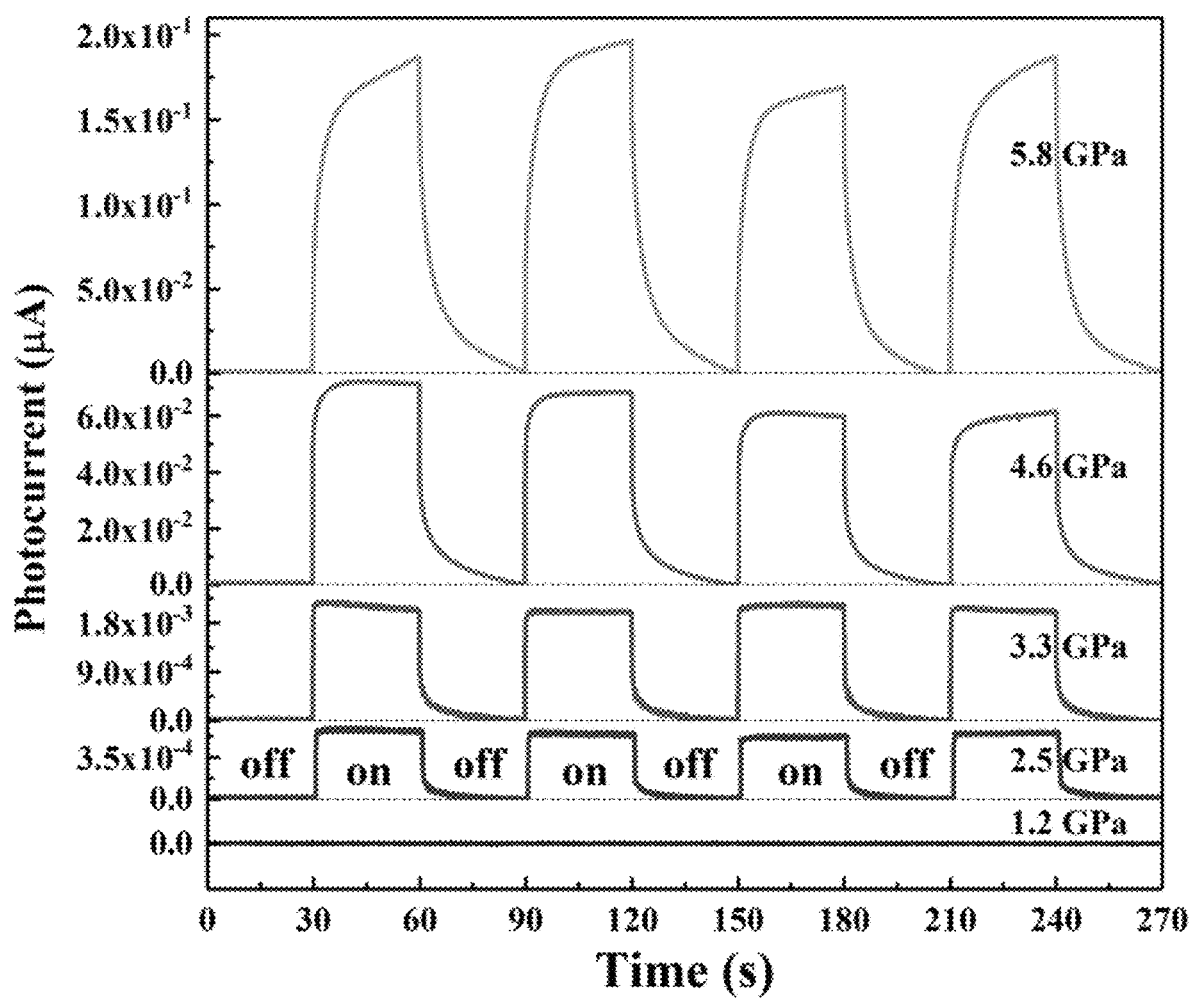
FIG. 2 shows current-time curves of semiconductor iodine with a near-infrared laser at pressures from 1.2 GPa to 5.8 GPa.

FIG. 2 shows current-time curves of semiconductor iodine with a near-infrared laser at pressures from 1.2 GPa to 5.8 GPa. It can be seen from FIG. 2 that when the pressure is 1.2 GPa, there is no significant change in the current with or without illumination, indicating that there is no photoresponse at the current pressure.

Embodiment 3

After Embodiment 2 is completed, the pressurizing screws continue to be slowly rotated by using the hex wrench, to drive the upper and lower diamonds to approach each other and thereby apply a pressure to the semiconductor iodine, such that the pressure in the sample chamber is 2.5 GPa, and the pressure is calibrated by the ruby.

The enameled wires with insulation-removed ends are connected to the two probes of the digital source-meter 5, and a 5 V bias voltage is applied to the semiconductor iodine by the digital source-meter 5. A near-infrared laser 8 with a wavelength of 1064 nm is used to irradiate the semiconductor iodine through the diamonds, and an optical power density of the laser irradiated onto the semiconductor iodine is about 0.8 mW/cm$^2$. An electronic shutter is used to precisely control a time with or without illumination. The time with/without illumination is set to 30 seconds, and one cycle is 60 seconds. By recording and observing current-time curves for 5 cycles, it is determined whether the semiconductor iodine has a photoresponse to the near-infrared light with the wavelength of 1064 nm.

It can be seen from FIG. 2 that when the pressure is 2.5 GPa, there is a significant change in the current with or without illumination, indicating that there is a photoresponse at the current pressure.

Embodiment 4

After Embodiment 3 is completed, the pressurizing screws continue to be slowly rotated by using the hex wrench, to drive the upper and lower diamonds to approach each other and thereby apply a pressure to the semiconductor iodine, such that the pressure in the sample chamber is 4.6 GPa, and the pressure is calibrated by the ruby.

The enameled wires with insulation-removed ends are connected to the two probes of the Keithley digital source-meter, and a 5 V bias voltage is applied to the semiconductor iodine by the digital source-meter 5, A near-infrared laser 8 with a wavelength of 1064 nm is used to irradiate the semiconductor iodine through the diamonds, and an optical power density of the laser irradiated onto the semiconductor iodine is about 0.8 mW/cm$^2$. An electronic shutter is used to precisely control a time with or without illumination. The time with/without illumination is set to 30 seconds, and one cycle is 60 seconds. By recording and observing current-time curves for 5 cycles, it is determined whether the semiconductor iodine has a photoresponse to the near-infrared light with the wavelength of 1064 nm.

It can be seen from FIG. 2 that when the pressure is 4.6 GPa, there is a significant change in the current with or without illumination, indicating that there is a photoresponse at the current pressure.

Embodiment 5

After Embodiment 4 is completed, the pressurizing screws continue to be slowly rotated by using the hex wrench, to drive the upper and lower diamonds to approach each other and thereby apply a pressure to the semiconductor iodine, such that the pressure in the sample chamber is 5.8 GPa, and the pressure is calibrated by the ruby.

The enameled wires with insulation-removed ends are connected to the two probes of the Keithley digital source-meter, and a 5 V bias voltage is applied to the semiconductor iodine by the digital source-meter 5, A near-infrared laser 8 with a wavelength of 1064 nm is used to irradiate the semiconductor iodine through the diamonds, and an optical power density of the laser irradiated onto the semiconductor iodine is about 0.8 mW/cm$^2$. An electronic shutter is used to precisely control a time with or without illumination. The time with/without illumination is set to 30 seconds, and one cycle is 60 seconds. By recording and observing current-time curves for 5 cycles, it is determined whether the semiconductor iodine has a photoresponse to the near-infrared light with the wavelength of 1064 nm.

It can be seen from FIG. 2 that when the pressure is 5.8 GPa, there is a significant change in the current with or without illumination, indicating that there is a photoresponse at the current pressure.

Figure 3:
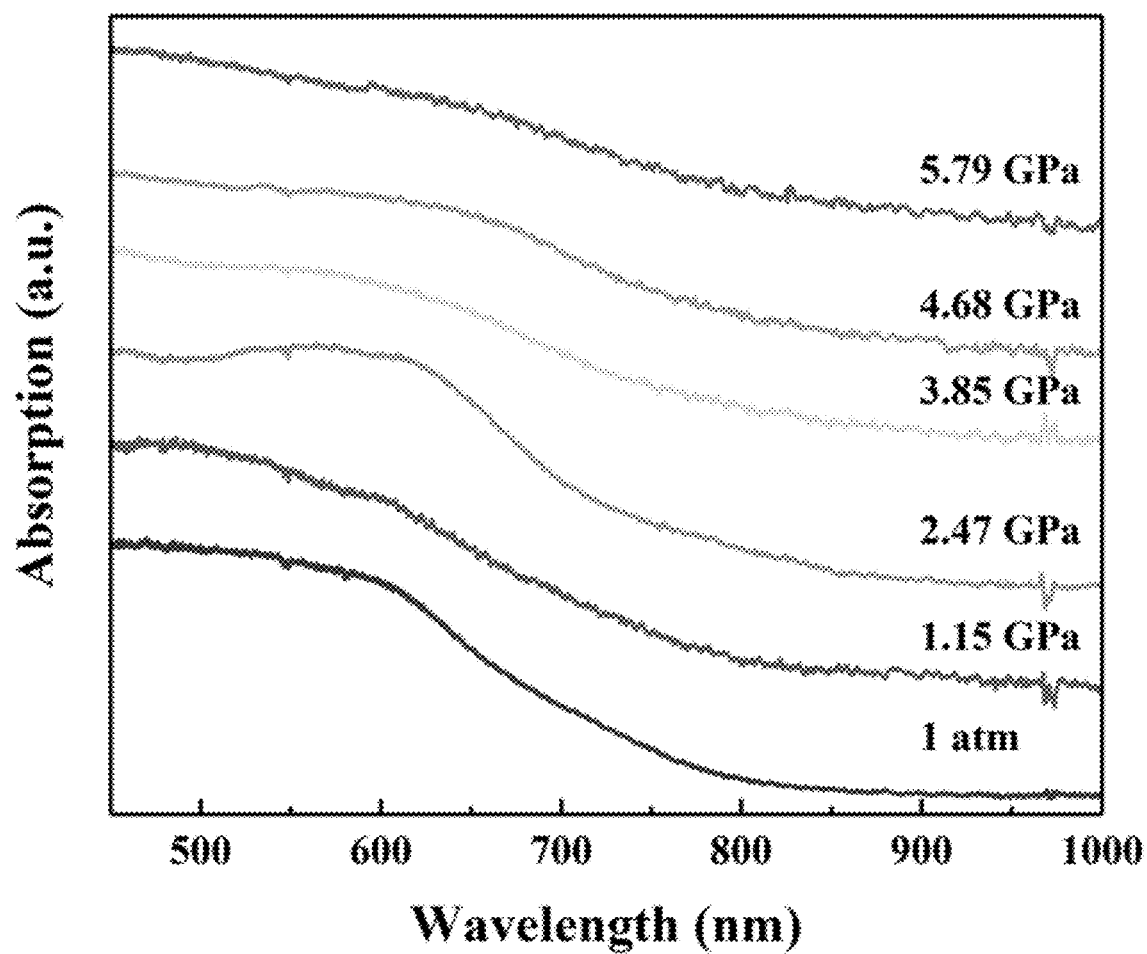
FIG. 3 is an absorption spectrum of semiconductor iodine in a compression process.
Figure 4:
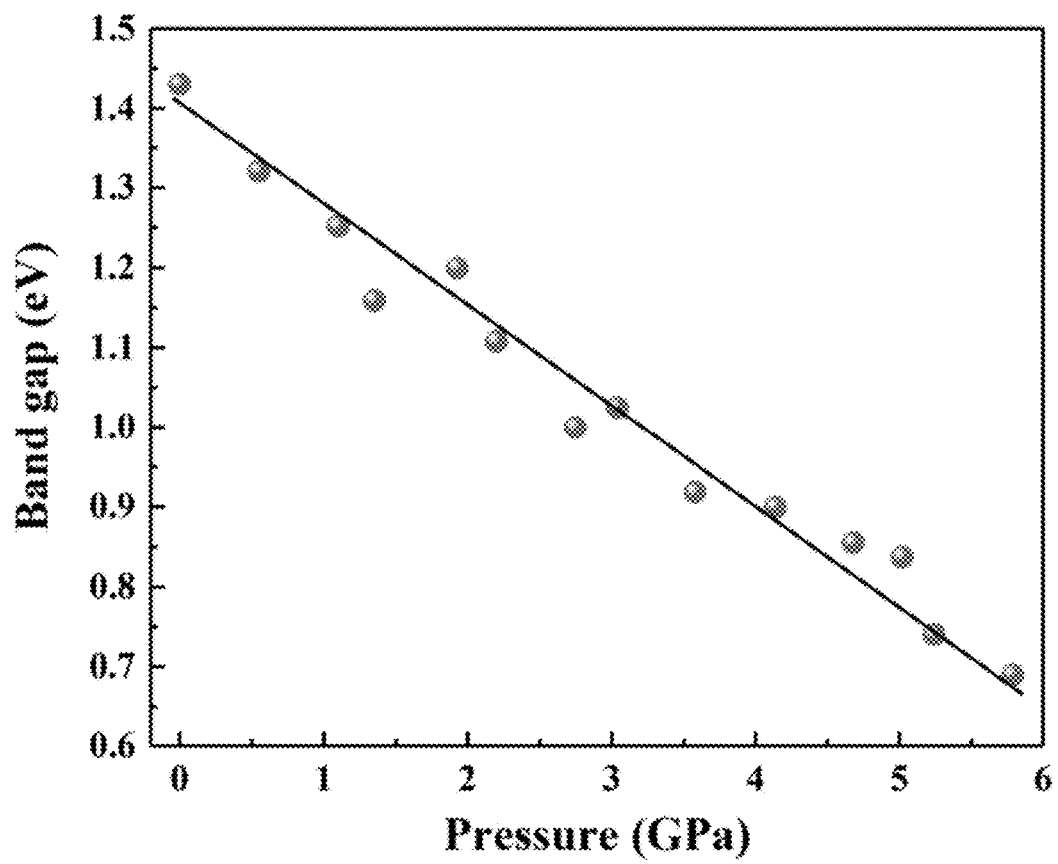
FIG. 4 is a diagram of a variation curve of a band gap of semiconductor iodine with pressure.

FIG. 3 shows absorption spectrums of the semiconductor iodine in the pressurizing process. FIG. 4 shows changes in the band gap of the semiconductor iodine with pressure. As shown in FIG. 3 and FIG. 4, it is found that the band gap of the semiconductor iodine is less than 1.165 eV at about 2.5 GPa, such that the 1064 nm near-infrared light is absorbed, which in turn generates a photoresponse.

Embodiment 6

Figure 5:
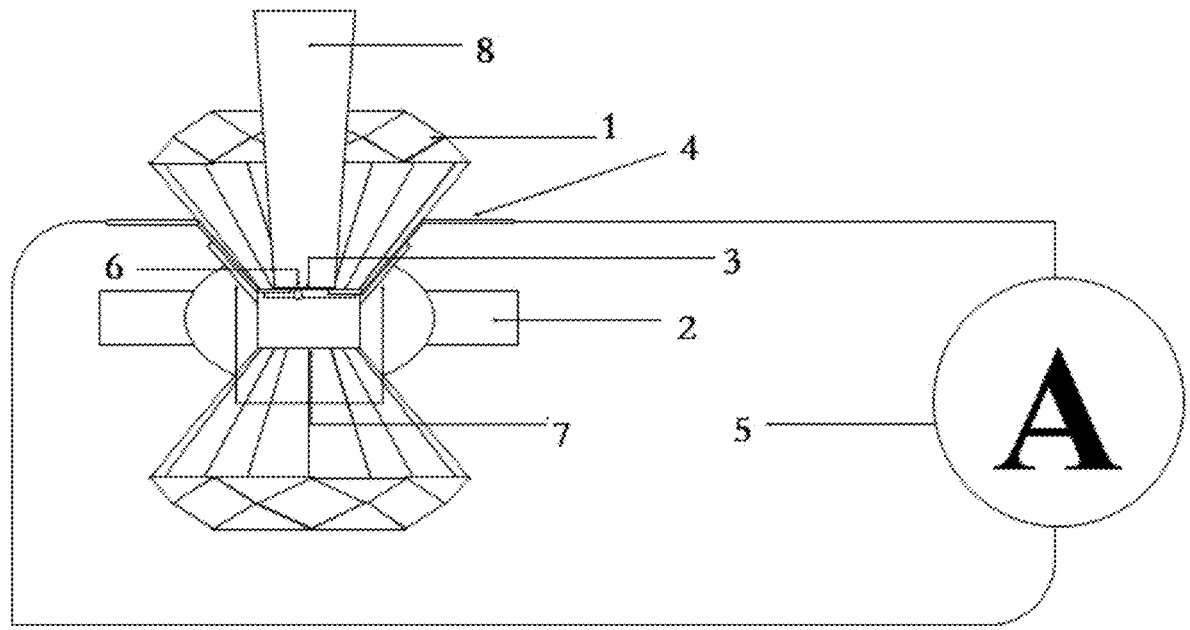
FIG. 5 is a principle diagram of a system for regulating a photoelectric spectral response range according to the present disclosure.

FIG. 5 is a principle diagram of a system for regulating a photoelectric spectral response range according to the present disclosure. As shown in FIG. 5, the system for regulating a photoelectric spectral response range includes: an diamond anvil cell 1, a gasket material 2, a photoelectric material 3, two platinum electrodes 4, and a digital source-meter 5.

The diamond anvil cell 1 includes pressurizing screws, and the pressurizing screws are configured to apply a high pressure to the photoelectric material 3.

The gasket material 2 includes a sample chamber, and culet faces of the diamond anvil cell 1 are embedded in the sample chamber; and the photoelectric material 3 is placed in the sample chamber, the culets are on the photoelectric material 3, and the photoelectric material 3 and the sample chamber are insulated from each other.

Two ends of the photoelectric material 3 each are connected to one of the platinum electrodes 4, and the two electrodes are respectively connected to probes of the digital source-meter 5; and the digital source-meter 5 is used to apply a 5 V bias voltage to the photoelectric material 3 and display a current-time curve at a preset pressure.

The present disclosure uses a high-pressure in-situ photoelectric experimental technology to apply a high pressure to the semiconductor iodine, to change the size of a band gap and thereby regulate its photoelectric spectral response range. In this method, no doping needs to be introduced, and the scale of a material does not need to be adjusted either. The method is simple and efficient, and is of great reference significance to widening a photoelectric spectral response range of a semiconductor material with a wide band gap.

Each embodiment of this specification is described in a progressive manner, each embodiment focuses on the difference from other embodiments, and the same and similar parts between the embodiments may refer to each other. For the system disclosed in the embodiments, since the system corresponds to the method disclosed in the embodiments, the description is relatively simple, and reference can be made to the method description.

In this specification, several specific embodiments are used for illustration of the principles and implementations of the present disclosure. The description of the foregoing embodiments is used to help illustrate the method of the present disclosure and the core idea thereof. In addition, persons of ordinary skill in the art can make various modifications in terms of specific implementations and the scope of application in accordance with the idea of the present disclosure. In conclusion, the content of this specification shall not be construed as a limitation to the present disclosure.

What is claimed is:

1. A method for regulating a photoelectric spectral response range, comprising:
    pre-pressurizing a gasket material by using a diamond anvil cell, and using a laser to drill a circular hole at the center of indentation as a sample chamber;
    padding the sample chamber with a layer of photoelectric material, wherein two ends of the photoelectric material each are connected to one platinum sheet as an electrode;
    respectively connecting the two electrodes to probes of a digital source-meter, and using the digital source-meter to apply a 5 V bias voltage to the photoelectric material;
    placing a pressure calibration substance in the sample chamber of the diamond anvil cell for pressure calibration;
    closing the diamond anvil cell, rotating pressurizing screws, and applying a high pressure to the photoelectric material, to make a pressure in the sample chamber reach a preset pressure;
    irradiating a near-infrared laser onto the photoelectric material through diamonds, controlling the presence or absence of illumination, and using the digital source-meter to display a current-time curve at the preset pressure; and
    determining a photoelectric spectral response range based on current-time curves at a plurality of different preset pressures.

2. The method for regulating a photoelectric spectral response range according to claim 1, wherein insulation is performed between the electrodes and the sample chamber.

3. The method for regulating a photoelectric spectral response range according to claim 2, wherein the insulation between the electrodes and the sample chamber is performed in the following manner:
    filling the sample chamber with boron nitride powder and pre-pressurizing to 20 GPa or higher, to make the boron nitride powder closely fit the sample chamber for insulation.

4. The method for regulating a photoelectric spectral response range according to claim 1, wherein the respectively connecting the two electrodes to probes of a digital source-meter specifically comprises:

respectively connecting insulation-removed ends of two enameled wires to the two electrodes, connecting the other end of one of the enameled wires to one probe of the digital source-meter, and connecting the other end of the other enameled wire to the other probe of the digital source-meter.

5. The method for regulating a photoelectric spectral response range according to claim 1, wherein the controlling the presence or absence of illumination, and using the digital source-meter to display a current-time curve at the preset pressure specifically comprises:
setting a time with illumination as a first setting time and a time without illumination as a second setting time, the sum of the first setting time and the second setting time being one period, and displaying the current-time curve at the preset pressure by means of the digital source-meter.

6. The method for regulating a photoelectric spectral response range according to claim 1, wherein the applying a high pressure to the photoelectric material specifically comprises:
setting an initial pressure to 1.2 GPa, and keeping a pressure gradient within 1.5 GPa.

7. The method for regulating a photoelectric spectral response range according to claim 6, wherein the high pressure ranges from 1.2 GPa to 5.8 GPa.

8. The method for regulating a photoelectric spectral response range according to claim 1, wherein the photoelectric material is semiconductor iodine.

9. The method for regulating a photoelectric spectral response range according to claim 1, wherein the pressure calibration substance is a ruby.

10. A system for regulating a photoelectric spectral response range, wherein the system for regulating a photoelectric spectral response range is applied to the method for regulating a photoelectric spectral response range according to claim 1, and the system for regulating a photoelectric spectral response range comprises: an diamond anvil cell, a gasket material, a photoelectric material, two platinum electrodes, and a digital source-meter, wherein
the diamond anvil cell comprises pressurizing screws, and the pressurizing screws are configured to apply a high pressure to the photoelectric material;
the gasket material comprises a sample chamber, and culet faces of the diamond anvil cell are embedded in the sample chamber; and the photoelectric material is placed in the sample chamber, the culets are on the photoelectric material, and the photoelectric material and the sample chamber are insulated from each other; and
two ends of the photoelectric material each are connected to one of the platinum electrodes, and the two platinum electrodes are respectively connected to probes of the digital source-meter; and the digital source-meter is used to apply a 5 V bias voltage to the photoelectric material and display a current-time curve at a preset pressure.

11. The system for regulating a photoelectric spectral response range according to claim 10, wherein insulation is performed between the electrodes and the sample chamber.

12. The system for regulating a photoelectric spectral response range according to claim 11, wherein the insulation between the electrodes and the sample chamber is performed in the following manner:
filling the sample chamber with boron nitride powder and pre-pressurizing to 20 GPa or higher, to make the boron nitride powder closely fit the sample chamber for insulation.

13. The system for regulating a photoelectric spectral response range according to claim 10, wherein the respectively connecting the two electrodes to probes of a digital source-meter specifically comprises:
respectively connecting insulation-removed ends of two enameled wires to the two electrodes, connecting the other end of one of the enameled wires to one probe of the digital source-meter, and connecting the other end of the other enameled wire to the other probe of the digital source-meter.

14. The system for regulating a photoelectric spectral response range according to claim 10, wherein the controlling the presence or absence of illumination, and using the digital source-meter to display a current-time curve at the preset pressure specifically comprises:
setting a time with illumination as a first setting time and a time without illumination as a second setting time, the sum of the first setting time and the second setting time being one period, and displaying the current-time curve at the preset pressure by means of the digital source-meter.

15. The system for regulating a photoelectric spectral response range according to claim 10, wherein the applying a high pressure to the photoelectric material specifically comprises:
setting an initial pressure to 1.2 GPa, and keeping a pressure gradient within 1.5 GPa.

16. The system for regulating a photoelectric spectral response range according to claim 15, wherein the high pressure ranges from 1.2 GPa to 5.8 GPa.

17. The system for regulating a photoelectric spectral response range according to claim 10, wherein the photoelectric material is semiconductor iodine.

18. The system for regulating a photoelectric spectral response range according to claim 10, wherein the pressure calibration substance is a ruby.

\* \* \* \* \*